United States Patent [19]
Webb

[11] 3,975,680
[45] Aug. 17, 1976

[54] NON-CONTACT COUPLING PLATE FOR CIRCUIT BOARD TESTER

[75] Inventor: Larry J. Webb, Phoenix, Ariz.

[73] Assignee: Honeywell Information Systems, Inc., Waltham, Mass.

[22] Filed: June 25, 1975

[21] Appl. No.: 590,356

[52] U.S. Cl. .......................... 324/61 P; 324/73 PC; 324/158 R
[51] Int. Cl.² ......................................... G01R 27/02
[58] Field of Search ............ 324/61 R, 61 P, 158 P, 324/158 F, 158 R, 73 PC

[56] References Cited
UNITED STATES PATENTS

| 2,932,790 | 4/1960 | Davis et al. ....................... 324/61 P |
| 3,243,701 | 3/1966 | Strand ............................. 324/61 R |

OTHER PUBLICATIONS

Brown, Dielectric Sensing Device, IBM Technical Disclosure Bulletin, Oct. 1959, p. 1.

Boehringer et al., Electrical Probe Control, IBM Technical Disclosure Bulletin, Nov. 1970.

*Primary Examiner*—Stanley T. Krawczewicz
*Attorney, Agent, or Firm*—William W. Holloway, Jr.; Edward W. Hughes

[57] ABSTRACT

A circuit circuit tester is provided for testing circuit runs of a circuit board for electrical continuity and electrical shorts. An electrical probe connected to one side of a capacitance meter is used to contact a particular circuit run, and an electrically conductive plate connected to the other side of the capacitance meter is maintained co-planar with and in close proximity to the circuit board to provide a suitable ground in the electrical test circuit, the capacitance of which circuit is a function of the electrical integrity of the circuit run. The measured capacitance is compared to a predetermined capacitance value for an identical circuit run of known acceptable quality to determine the electrical integrity of the tested circuit run.

6 Claims, 5 Drawing Figures

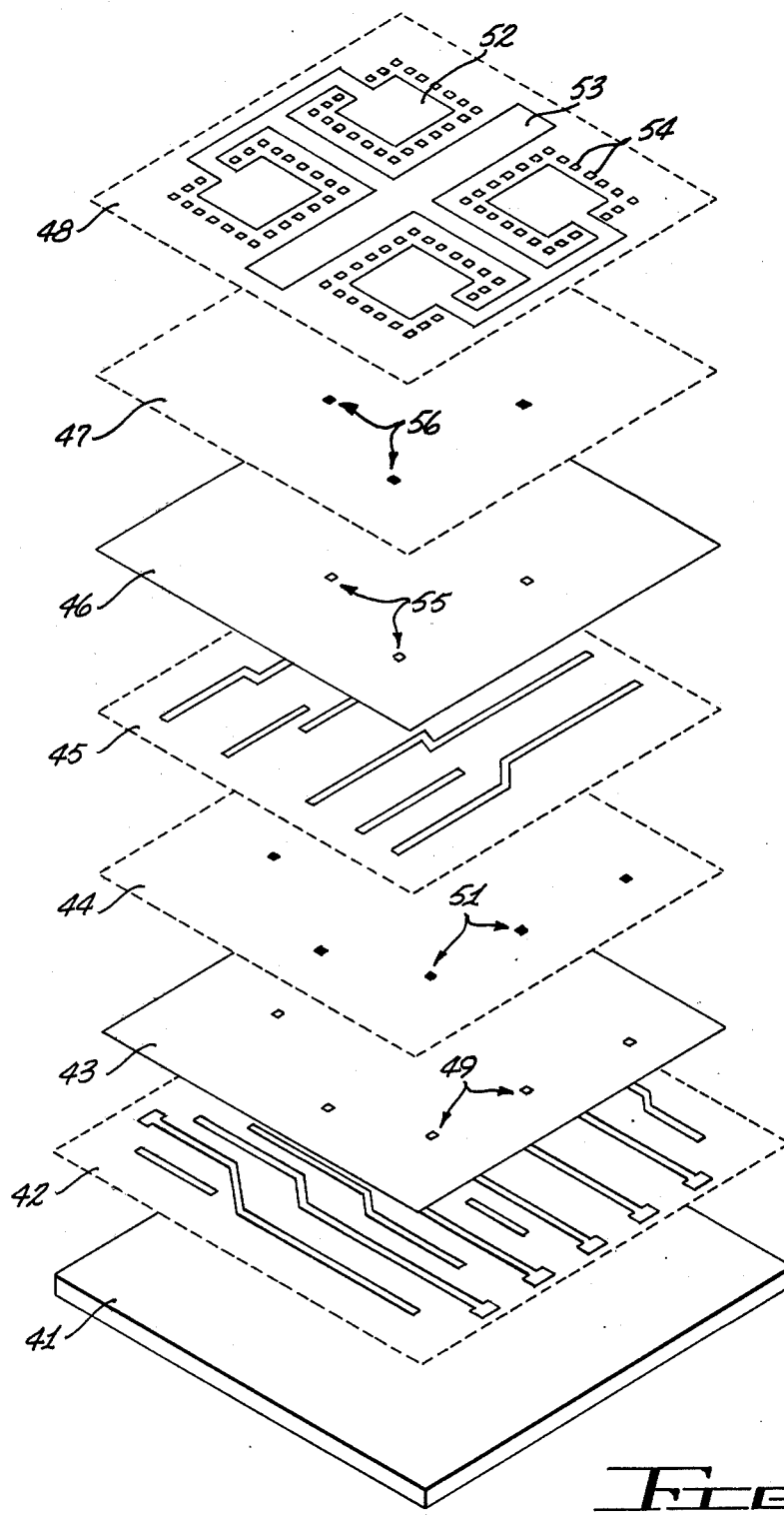

NON-CONTACT COUPLING PLATE FOR CIRCUIT BOARD TESTER

BACKGROUND OF THE INVENTION

This invention relates generally to circuit board testers and, in particular, to a circuit board tester having a non-contact, electrically conductive grounding or reference plate.

In the art of packaging and interconnecting electronic devices, there is a notable trend towards devices of increased complexity and density. Regarding circuit boards in particular, there is a definite gravitation towards multiple layer circuit boards having large numbers of closely spaced circuit runs. The presence of internally arranged conductors in these boards makes visual inspection of the conductors for electrical continuity and electrical shorts virtually impossible, so that testing techniques must be employed which are based upon the electrical conductivity of the conductors.

In the art of circuit board testers, devices are known for testing the electrical integrity of circuit runs by contacting the ends of the circuit runs, either in step-and-repeat fashion using two probes or in simultaneous fashion using a fixed probe tester, and observing the electrical characteristics.

When a two-probe tester is used, one probe is placed in contact with one end of the circuit run to be tested. The other end or ends of this particular run are then contacted by the other probe to test for electrical continuity. In order to test for shorts, the second probe is sequentially applied to all of the other circuit runs to determine whether a closed circuit condition is indicated, representing the fact that the circuit run under test is shorted to one of the other circuit runs. For this type of testing, at least $N + (N-1) + (N-2) + \ldots +1$ tests are required, N representing the number of circuit runs for a given circuit board.

With a fixed probe tester, a probe must be provided for each end of all circuit runs, and the number of probes required may be in the order of several thousand. To check a particular circuit run for electrical continuity using a fixed probe tester, all of the probes are electrically connected to the tester. A good electrical path will indicate a low resistance reading between the probes associated with the ends of the circuit run under test. To test for shorts, all runs except the one to be tested are grounded to one side of the tester, and a probe connected to the other side of the tester is applied to the circuit run under test. The circuit run under test should provide a high resistance reading if it is not shorted to any of the other circuit runs.

Fixed probe type testers are very expensive due to their complexity and to the relatively high maintenance costs associated with their fragile, short-lived probe heads. Testers of the two-probe type are relatively low in cost compared to the multiple-probe type; however, the test cycle is extremely time-consuming.

A further known circuit board tester overcomes certain of the disadvantages of the other prior art testers, in that it requires only two probes and only one measurement for each circuit run tested. This tester, described in "Continuity Testing by Capacitance," Robert W. Wedwick, Published Circuits Manufacture, Nov., 1974, pp. 60 and 61, utilizes measurements of the distributed capacitance between a circuit run and a reference plane such as a ground or power plane to identify electrical shorts and discontinuities. By comparing the measured capacitance value for a particular circuit run with the capacitance of a known good circuit run, an accurate indication of the electrical integrity of the measured circuit run can be obtained. Using this type of tester, one of the test probes is attached to the ground or power plane of the circuit board, and the other test probe is sequentially applied to the end of each circuit run, taking a capacitance reading for each circuit run and comparing such reading to a previously obtained capacitance value for a known good circuit run.

The present invention is directed to an improvement over the last-mentioned type of circuit board tester, in that it eliminates the necessity for directly connecting the ground or reference side of the tester to the ground plane or power plane of the circuit board, thereby substantially increasing the operational speed of the testing process and simplifying the design of the tester.

SUMMARY OF THE INVENTION

It is therefore an object of the present invention to provide an improved circuit board tester.

It is also an object of the present invention to provide a circuit board tester of relatively simple construction which is capable of relatively fast operation.

It is a further object of the present invention to provide a circuit board tester of the capacitance-measuring type, wherein a test probe connected to one side of a capacitance meter is placed in contact with a circuit run under test and a test probe connected to the other side of the capacitance meter is secured to an electrically conductive plate which is maintained co-planar with and in close proximity to the circuit board, which plate serves as a reference or ground in the test circuit.

These and other objects of the present invention are achieved in accordance with a preferred embodiment of the invention by providing a capacitance meter, a probe connected to one side of the capacitance meter for contacting individual circuit runs on the circuit board under test, and an electrically conductive plate connected by means of a probe to the other side of the capacitance meter, which plate is maintained co-planar with and in close proximity to the circuit board. According to a preferred embodiment, the plate has an aperture through which the probe extends to make contact with the circuit run, although other geometrics are also possible.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 2 shows an exploded view of one type of circuit board capable of being tested by the circuit board tester of the present invention.

DETAILED DESCRIPTION OF THE INVENTION

Figure 1:
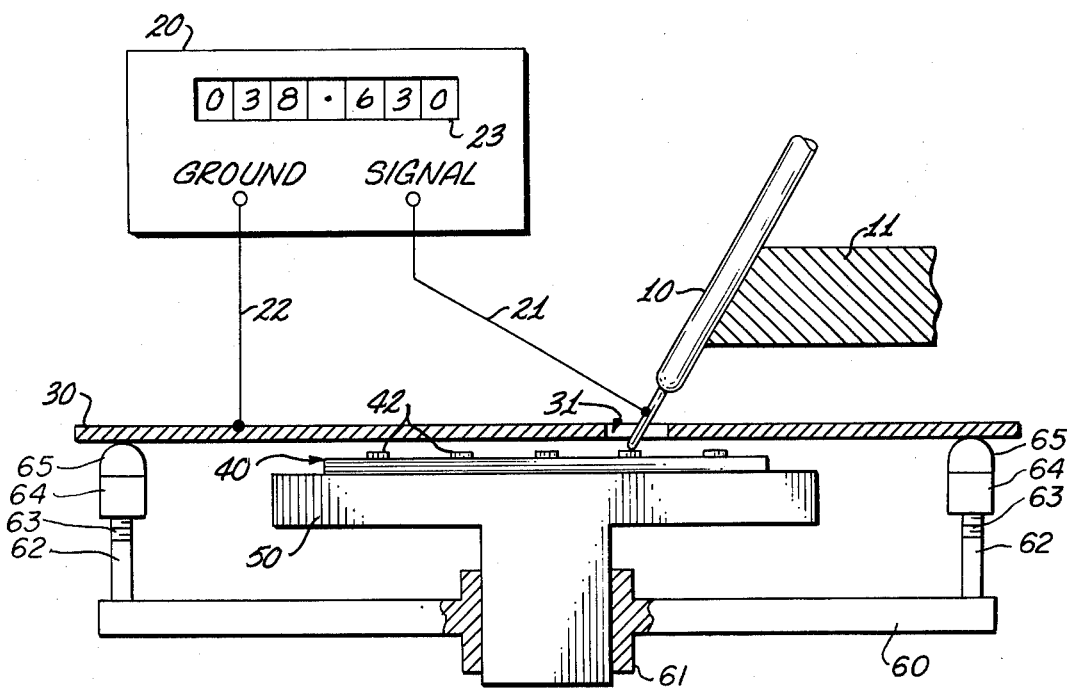
FIG. 1 shows a partially schematic, partially representational illustration of a preferred embodiment of the circuit board tester of the present invention.

FIG. 1 shows a partially schematic, partially representational view of a circuit board tester according to a preferred embodiment of the present invention, including probe 10, capacitance meter 20, non-contact coupling plate 30, circuit board 40 with circuit runs 42 associated therewith, and circuit board support 50. Capacitance meter 20 has a visual indicator 23 for representing measured values of capacitance. A suitable, commercially available meter is Systron Donner's Digital L-C Meter, Model 9400, Concord, Calif.

A first lead 21 from the SIGNAL side of capacitance meter 20 is electrically connected to probe 10, and a second lead 22 connected to the GROUND side of the capacitance meter 20 is electrically connected to coupling plate 30 by any suitable means. Probe 10 is securely fixed to probe support 11. Alternatively, probe 10 may be manually held. Probe 10 extends through the aperture 31 in coupling plate 30 to contact a portion of a circuit run 42 associated with circuit board 40.

In a preferred embodiment the circuit board support 50 is movable in the Z, or vertical, direction with respect to base 60 by means of bearing 61. The details of the mechanism for moving support 50 with respect to base 60 is not illustrated since such a mechanism is conventional and well-known. FIG. 1 illustrates circuit board support 50 in its uppermost position with circuit board 40 closely adjacent to coupling plate 30. Circuit board support 50 may also be lowered to a loading-unloading position (not shown). To support coupling plate 30 in close proximity to and substantially co-planar with circuit board 40, a plurality, at least three, posts 62, are mounted on base 60. In FIG. 1, only two posts 62 are illustrated. Posts 62 are provided with threads 63 so that the holders 64 may be moved relative to base 60 in the vertical, or Z, direction. The upper contact portion 65 of each of the holders 64 are formed of an electrical insulating material and contact the bottom side of plate 30. By appropriate adjustments of the holders 64 on posts 62 plate 30 can be held, or positioned, so that it is substantially co-planar with and in close proximity to circuit board 40. Coupling plate 30 is translatable, according to the preferred embodiment, in two directions, hereinafter referred to as the X and Y directions, to permit probe 10 to contact any desired exposed terminals of the circuit runs 42 associated with circuit board 40. Mechanisms for automatically indexing coupling plate 30 and probe 10 in the X and Y directions and for raising and lowering circuit board support 50 may be provided if desired. A suitable automatic circuit board prober mechanism is commercially available in the form of Electroglas Model 1034X, Santa Clara, Calif.

Coupling plate 30 may be made of any electrically conductive material. In the preferred embodiment plate 30 is made of aluminum. By nickel-plating the surface of the aluminum plate closest to the circuit board, the high frequency conductive properties of the plate 30 may be improved. If it is desired to have the plate 30 directly contact the surface of the circuit board 40, a suitable insulation layer should be provided between the conductive portion of the plate 30 and the circuit board 40; this may be done by anodizing the surface of the aluminum plate 30, for example.

Referring now to FIG. 2, an exploded view of a typical circuit board 40 is illustrated. It will be apparent to one skilled in the art that the present invention may be utilized with a wide variety of circuit board types. The circuit board shown comprises a substrate 41 several millimeters in thickness of thermo-resinous or ceramic material. Superimposed upon substrate 41 are a plurality of signal runs 42, which may terminate in well-defined input/output terminal pads. Circuit runs 42 are arranged generally in the same direction, although individual runs may contain jogs or zig-zags. Signal runs 42 are electrically isolated from the layers above by means of a first dielectric layer 43, which layer contains a number of apertures 49 at those locations where runs 42 are intended to make electrical contact with circuit runs 45 above. Once dielectric layer 43 has been laid down, layer 44 comprising a number of via fills 51, corresponding to the apertures 49 in the dielectric layer 43, is added.

Next, another grouping of signal lines 45 is laid down, which lines may generally run in a different direction as shown. On top of this a second dielectric layer 46 containing further apertures 55 in different locations is added, following which a second layer 47 with via fills 56 corresponding to apertures 55 is superimposed. Finally, an uppermost layer 48 comprising chip bonding pads 52, chip outer lead bonding pads 54, and a power distribution plane 53 is added.

Figure 3:
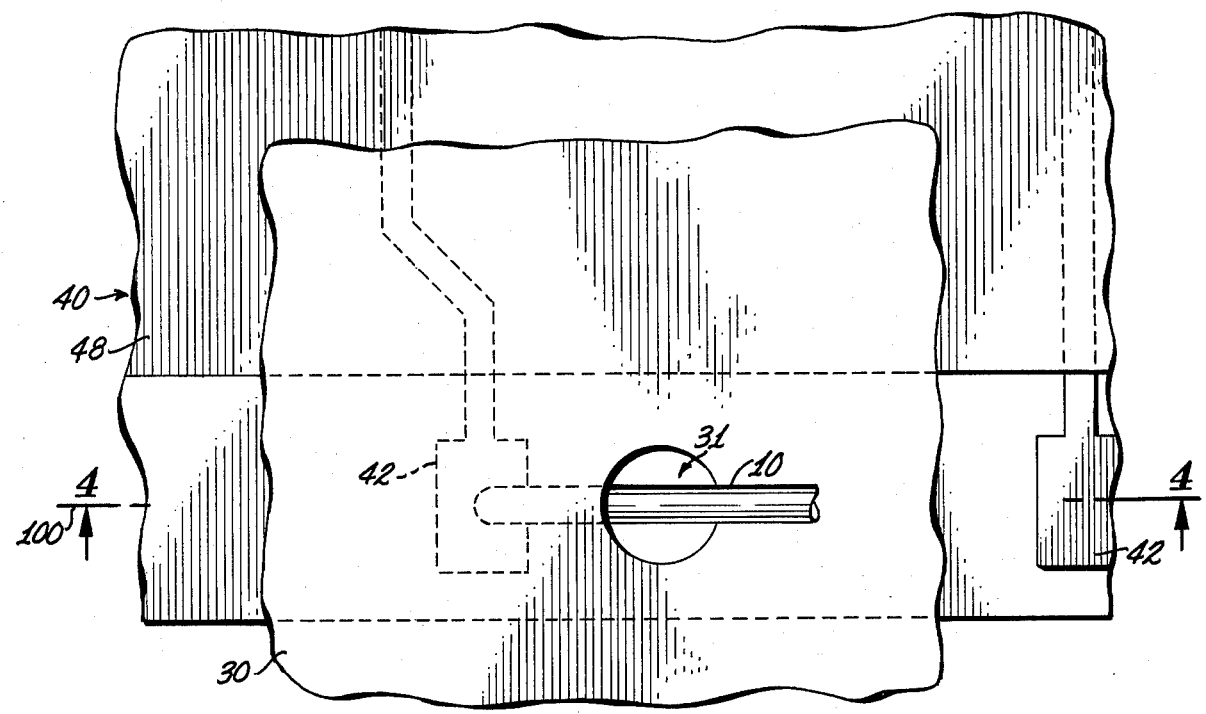
FIG. 3 shows a top view of the non-contact, electrically conductive coupling plate of the circuit board tester of the present invention.

Referring to FIG. 3, a top view is shown of the coupling plate 30 overlying the circuit board 40. The aperture 31 in coupling plate 30 may be seen through which probe 10 extends to contact the signal run 42 of circuit board 40.

Figure 4:
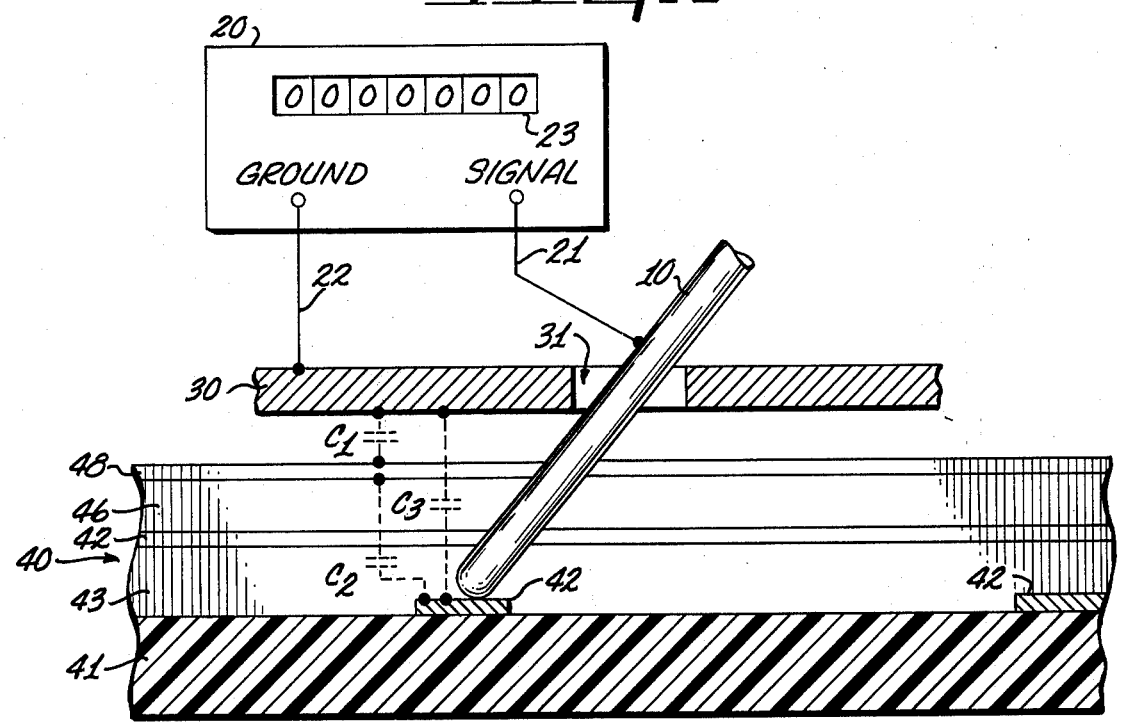
FIG. 4 shows a partially diagrammatic, partially representational illustration of the circuit board tester of the present invention, in the form of a cross-section taken along line 100 of FIG. 3.

FIG. 4 shows a partially diagrammatic, partially representational illustration of the circuit board tester and circuit board. Circuit board 40 is shown in greatly exaggerated detail in order to illustrate the primary capacitance elements $C_1$, $C_2$, and $C_3$ of the electrical test circuit. The test circuit comprises line 21 connecting the electrically conductive probe 10 to the SIGNAL side of the capacitance meter 20, circuit run 42, the primary capacitance elements $C_1$-$C_3$, coupling plate 30, and line 22 connecting coupling plate 30 to the GROUND side of the capacitance meter 20.

$C_1$ represents the effective capacitance between coupling plate 30 and the large power distribution plane 48. Capacitance $C_2$ represents the effective capacitance between the power plane 48 and the particular signal run 42 under test. Capacitance $C_3$ represents the effective capacitance between the coupling plate 30 and the signal run 42 under test. Although other effective capacitance elements are present in the test circuit shown in FIG. 4, they may be ignored for the purpose of the present analysis because of their limited contribution in comparison to the contributions made by the primary capacitances $C_1$-$C_3$. A circuit analysis demonstrating that the total capacitance measured by capacitance meter 20 is primarily a function of the capacitance between coupling plate 30 and the signal run 42 under test appears below in connection with the description of FIG. 5.

Figure 5:
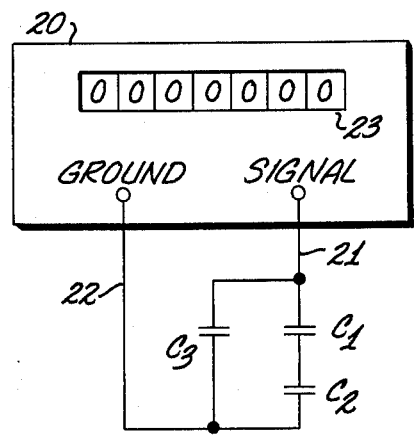
FIG. 5 shows a circuit diagram representing the primary capacitance elements within the circuit board test circuit.

With reference now to FIG. 5, a simplified circuit diagram is shown illustrating the primary capacitance elements $C_1$-$C_3$ of the capacitance test circuit. As mentioned above with regard to FIG. 4, capacitance $C_1$ represents the capacitance between coupling plate 30 and the large power distribution plane 48 of circuit board 40; capacitance $C_2$ represents the capacitance between power plane 48 and the signal run 42 under test; and capacitance $C_3$ represents the capacitance between coupling plate 30 and signal run 42. The total capacitance $C_T$ measured by capacitance meter 20 may be represented by the equation $$C_T = (C_1 C_2)/(C_1 + C_2) + C_3 \qquad (1)$$

Due to the fact that the power plane 48 is relatively large in comparison to the signal run 42, the value of $C_1$ will be much greater than that of $C_2$, or $$C_1 \gg C_2 \qquad (2)$$

$$\text{Thus } C_T \simeq (C_1 C_2/C_1) + C_3, \qquad (3)$$

or $$C_T \simeq C_2 + C_3 \qquad (4)$$

The capacitance between the power plane 48 and signal run 43 is also much greater than that between coupling plate 30 and signal run 42, so that $$C_2 \gg C_3 \qquad (5)$$

$$\text{Thus } C_T \simeq C_2 \qquad (6)$$

Equation (6) shows that the total capacitance $C_T$ measured by capacitance meter 20 is primarily a function of $C_2$, which is the capacitance between power plane 48 and signal run 42. The measured capacitance $C_T$ is compared to the predetermined capacitance value for an identical signal run which is known to be good. If the measured capacitance $C_T$ is much greater, say in the order of 50% to 100% greater, than the known capacitance, it may safely be assumed that the signal run 42 under test is shorted to another signal run. On the other hand, if the measured capacitance $C_T$ is much less, for example 50% less, than the known capacitance, signal run 42 can be assumed to contain an "open" in it.

It will be apparent to those skilled in the art that the disclosed Non-Contact Coupling Plate For Circuit Board Tester may be modified in numerous ways and may assume many embodiments other than the preferred embodiment specifically set out and described above. For example, coupling plate 30 may under some circumstances be designed to underlie circuit board 40, depending upon the relative locations of the power plane 48 and circuit runs 42 of circuit board 40. That is, in a circuit board configuration where the circuit runs 42 overlie the power plane 48, the coupling plate 30 may be positioned underneath circuit board 40, eliminating the necessity for translating coupling plate 30 in the X and Y directions in order to correctly position probe 10 in contact with circuit runs 42 through an aperture in the coupling plate 30.

Accordingly, it is intended by the appended claims to cover all modifications of the invention which fall within the true spirit and scope of the invention.

What is claimed is:

1. In an apparatus for testing the electrical integrity of a circuit run in a circuit board, wherein said apparatus comprises probe means for electrically contacting said circuit run and means connected to said probe means for measuring the capacitance of said circuit run, the improvement therein comprising
   an electrically conductive plate connected to said capacitance measuring means, and
   means for holding said plate co-planar with and in close proximity to said circuit board,
   whereby said probe means, said circuit run, and said plate comprise an electric circuit whose capacitance, as measured by said capacitance measuring means, is a function of the electrical integrity of said circuit run.

2. The improvement recited in claim 1, wherein said plate has an aperture through which said probe extends to make contact with said circuit run.

3. In an apparatus for testing the electrical continuity and electrical isolation of a circuit run in a circuit board, wherein said apparatus comprises probe means for electrically contacting said circuit run, means connected to said probe means for measuring the capacitance of said circuit run; and means for comparing the measured capacitance of said circuit run with a target capacitance value, the improvement therein comprising
   an electrically conductive plate connected to said capacitance measuring means, and
   means for holding said plate co-planar with and in close proximity to said circuit board,
   whereby said probe means, said circuit run, and said plate comprise an electric circuit whose capacitance, as measured by said capacitance measuring means, is a function of the electrical continuity and electrical isolation of said circuit run.

4. The improvement recited in claim 3, wherein said plate has an aperture through which said probe extends to make contact with said circuit run.

5. In an apparatus for testing the electrical continuity and electrical isolation of a circuit run in a multi-layer circuit board having a plurality of layers of electrical conductors, wherein said apparatus comprises probe means for electrically contacting a portion of said circuit run, means connected to said probe means for measuring the capacitance of said circuit run, and means for comparing the measured capacitance of said circuit run with a target capacitance value, the improvement therein comprising
   an electrically conductive plate connected to said capacitance measuring means, and
   means for holding said plate co-planar with and in close proximity to said circuit board,
   whereby said probe means, said circuit run, and said plate comprise an electric circuit whose capacitance, as measured by said capacitance measuring means, is a function of the electrical continuity and electrical isolation of said circuit run.

6. The improvement recited in claim 5, wherein said plate has an aperture through which said probe extends to make contact with said circuit run portion.

* * * * *